United States Patent
Lin

(10) Patent No.: US 7,672,133 B2
(45) Date of Patent: Mar. 2, 2010

(54) RETAINING DEVICE FOR A HEAT SINK

(75) Inventor: Sheng-Huang Lin, Kaohsiung (TW)

(73) Assignee: Asia Vital Components Co., Ltd., Kaohsiung (TW)

( * ) Notice: Subject to any disclaimer, the term of this patent is extended or adjusted under 35 U.S.C. 154(b) by 329 days.

(21) Appl. No.: 11/742,596

(22) Filed: May 1, 2007

(65) Prior Publication Data

US 2008/0273302 A1 Nov. 6, 2008

(51) Int. Cl.
*H05K 7/20* (2006.01)

(52) U.S. Cl. .................. 361/704; 361/709; 24/459; 165/121; 165/185

(58) Field of Classification Search ............ 361/679.54, 361/697, 703, 704, 709, 710, 719
See application file for complete search history.

(56) References Cited

U.S. PATENT DOCUMENTS

| | | | | |
|---|---|---|---|---|
| 5,860,195 A * | 1/1999 | Wang | ............................ | 24/459 |
| 5,953,212 A * | 9/1999 | Lee | ............................ | 361/709 |
| 6,310,774 B1 * | 10/2001 | Lee | ............................ | 361/704 |
| 6,621,704 B1 * | 9/2003 | Liu | ............................ | 361/704 |
| 7,215,550 B1 * | 5/2007 | Yang et al. | ................... | 361/704 |
| 7,292,442 B2 * | 11/2007 | Yu et al. | ...................... | 361/704 |
| D567,192 S * | 4/2008 | Lin | ............................ | D13/179 |
| D581,883 S * | 12/2008 | Lin | ............................ | D13/179 |
| 7,467,443 B2 * | 12/2008 | Lin | ............................ | 24/459 |
| 2008/0273301 A1 * | 11/2008 | Lin | ............................ | 361/687 |

* cited by examiner

*Primary Examiner*—Jayprakash N Gandhi
*Assistant Examiner*—Courtney Smith

(57) ABSTRACT

A retaining device for a heat sink includes a frame, at least an operation member and at least an engaging member. The frame is attached to an upper portion of the heat sink with a projection at two opposite sides thereof and the projection has a contact face. The operation member provides a main operation part and a stir part. The main operation part is disposed on top of the contact face and the stir part is actuated to rotate for the main operation part being capable of moving relative to the contact face. The engaging member further has a follower part piercing the projection with an end of the follower part connecting with the main operation part pivotally and another end of the follower part being joined to a first elastic part and a second elastic part respectively. The first elastic part and the second elastic part oppositely extend horizontally and free ends of both the elastic parts are joined to two opposite lateral sides of an engaging part for controlling the engaging force evenly and decreasing plastic deformation.

2 Claims, 7 Drawing Sheets

RETAINING DEVICE FOR A HEAT SINK

BACKGROUND OF THE INVENTION

1. Field of the Invention

The present invention is related to a retaining device for a heat sink and particularly to a device for fixing a heat sink.

2. Brief Description of the Related Art

The prior art such as Taiwan Utility Model publication No. 092205232 entitled "Retaining Tool for Heat Dissipation Component" provides a retaining tool being disposed in a locating recess of two opposite sides of a heat dissipation component. The retaining tool has an engaging plate, which is slid into the locating recess with the upper section thereof, providing an elastic part at the middle section thereof and providing an engaging hole at the lower section thereof for engaging a locking ear of a connecting base. The retaining tool further has an operation lever, which provides an actuation plate part being eccentrically joined to the upper section of the engaging plate and the outer contour is disposed on top of the heat dissipation component. Hence, the operation lever is stirred angularly and the actuation plate is capable of lifting the engaging plate such that the engaging plate can hook the locking ear tightly to allow the bottom of the heat dissipation component closely contacting a chip underneath. The actuation plate has a shaft hole disposed at a side of the actuation part for a pivotal pin being joined to the upper section of the engaging plate and has a handle part extending outward from the actuation plate. The elastic part has a shape of "S" or the like.

However, the problem of the preceding prior art is in that the elastic part has an insufficient angular bend due to space limitation of a host unit of the computer and it results in too little coefficient of elasticity, which is easy to create plastic deformation while in use.

SUMMARY OF THE INVENTION

In order to overcome the preceding disadvantages, an object of the present invention is to provide a retaining device for a heat sink with which more coefficient of elasticity is provided in a very limited space and easily controlled engaging force with good elastic restoration can be obtained so as to reduce possibility of plastic deformation.

accordingly, A retaining device for a heat sink includes a frame, at least an operation member and at least an engaging member. The frame is attached to an upper portion of the heat sink with a projection at two opposite sides thereof and the projection has a contact face. The operation member provides a main operation part and a stir part. The main operation part is disposed on top of the contact face and the stir part is actuated to rotate for the main operation part being capable of moving relative to the contact face. The engaging member further has a follower part piercing the projection with an end of the follower part connecting with the main operation part pivotally and another end of the follower part being joined to a first elastic part and a second elastic part respectively. The first elastic part and the second elastic part oppositely extend horizontally and free ends of both the elastic parts are joined to two opposite lateral sides of an engaging part for controlling the engaging force evenly and decreasing plastic deformation.

BRIEF DESCRIPTION OF THE DRAWINGS

The detail structure, the applied principle, the function and the effectiveness of the present invention can be more fully understood with reference to the following description and accompanying drawings, in which.

DETAILED DESCRIPTION OF THE INVENTION

Figure 1:
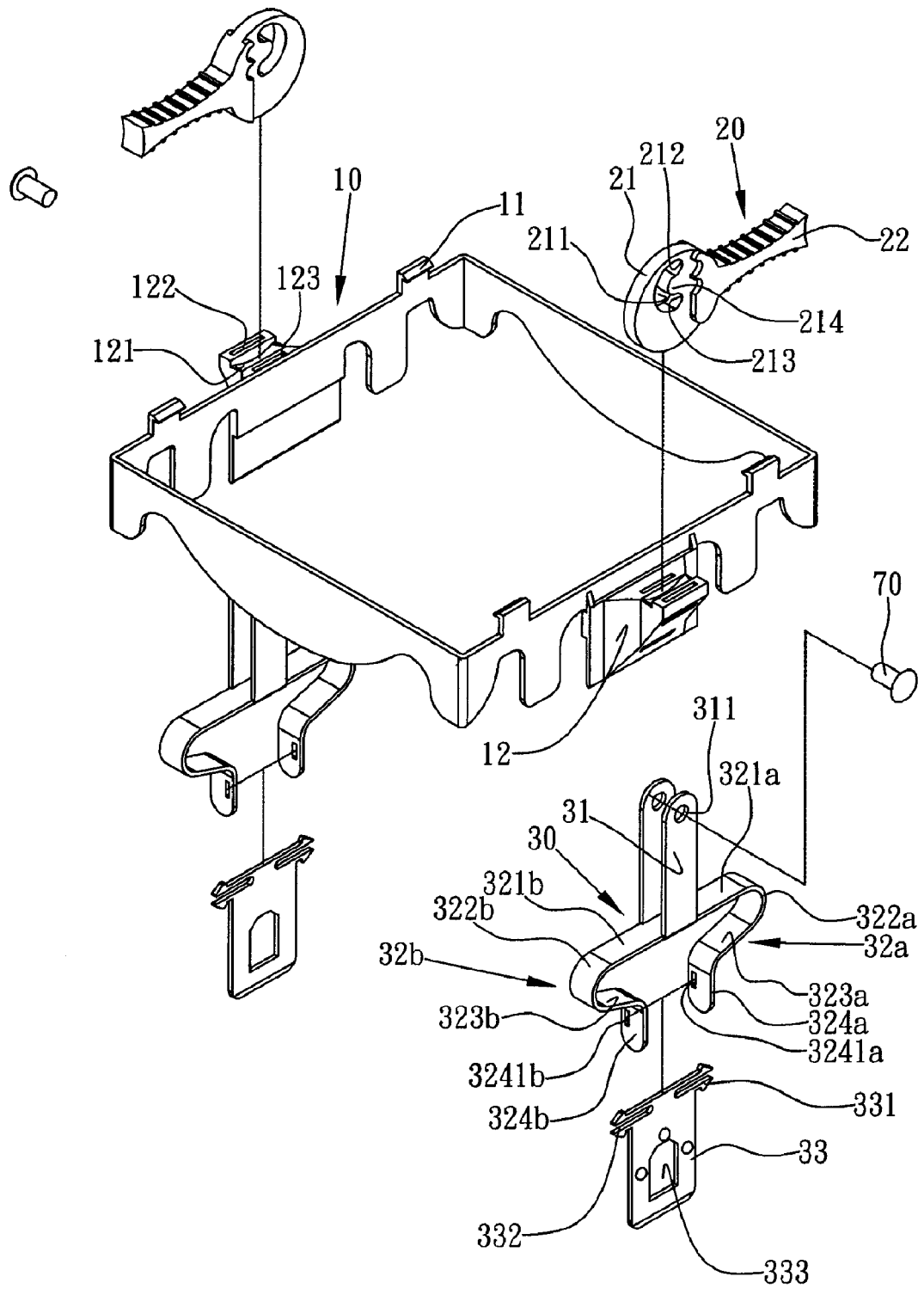
FIG. 1 is a disassembled perspective view of a retaining device for a heat sink according to the present invention.
Figure 2:
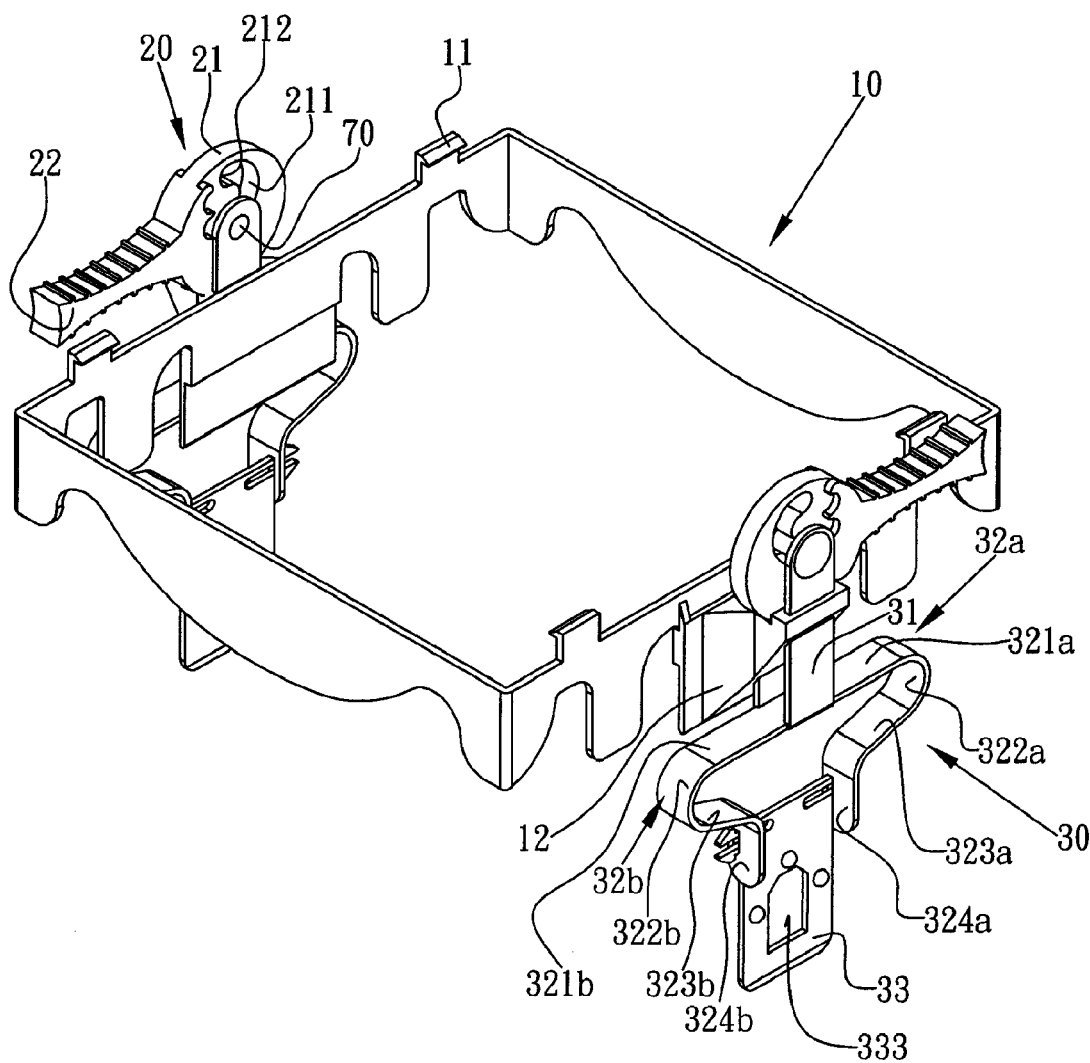
FIG. 2 is an assembled perspective view of the retaining device shown in FIG. 1.

Referring to FIGS. 1 and 2, the preferred embodiment of a retaining device for a heat sink according to the present invention includes a frame 10, at least an operation member 20 and at least an engaging member 30. The frame 10 is hollow and provides four enclosed frame edges. Two opposite ones of the frame edges each provide two inverted hooks 11 respectively for engaging a fan (not shown) and extend outward a projection 12 from the middle section thereof. The projection 12 has a contact face 121 with two slots 122, 123.

The operation member 20 is provided to correspond to the respective projection 12 and includes a main operation part 21 and a stir part 22 extending from the main operation part 21. The main operation part 21 is disposed on top of the contact face 121 of the respective projection 12. The stir part 22 is actuated to rotate the main operation part 21 such that the main operation part 21 is capable of moving relative to the contact face 121.

The main operation part 21 is circular disk shape with a guide groove 211 being provided therein to pierce two opposite lateral sides thereof and the guide groove 211 has a first end 212 and a second end 213. The guide groove 211 curvedly extends along radial direction of the main operation part 21 from the first end 212 to the second end so as to create a uvula 214 between the first end 212 and the second end 213.

The main operation part 21 can be acted as an eccentric cam and the contact face 121 of the projection 12 is concave downward to contact the main operation part 21 such that the main operation part 21 is capable of rotating on the contact face 121 steadily.

The engaging member 30 is provided to correspond to the projection 12 too and has a follower part 31 extending downward. A first elastic part 32a and a second elastic part 32b are oppositely disposed at the lower end of the follower part 31 in a way of extending rightward and leftward respectively. An end of the respective elastic part 32a, 32b extends downward to connect an engaging plate 33. The follower part 31 is composed of two parallel elongated plates with a pivot hole 311 at an end of the respective elongated plate and the respective end with the pivot hole 311 inserts through the slots 122, 123 of the projection 12 such that the elongated plates are disposed at two lateral sides of the main operation part 21 respectively. Further, a pivot 70 passes through the pivot hole 311 and the guide groove 211. In this way, the operation member 20 is capable of actuating the follower part 31 to move upward and downward.

The first and second elastic parts 32a, 32b each include a first elastic strip section 321a, 321b to joined to the follower part 31 respectively and extend a circular bend 322a, 322b and a second elastic strip section 323a, 323b. The lower end of the respective second elastic strip section 323a, 323b extends vertically to form a hook leg 324a, 324b with a joining hole 3241a, 3241b.

The engaging plate 33 provides a hook part 331, 332 at two ends of the upper side thereof corresponding to the joining hole 3241a, 3241b and an engaging hole 333 at the lower side thereof. Once the hook part 331, 332 inserts into the joining hole 3241a, 3241b, the first and second elastic parts 32a, 32b are capable of being attached to the right and left sides of the engaging plate 33. Further, it is noted that the first and second elastic members can be formed a shape of "U" or "C" instead of the configuration shown in the figures. In addition, the engaging plate 33 can be made integrally with the first and second elastic members 32a, 32b.

Figure 3:
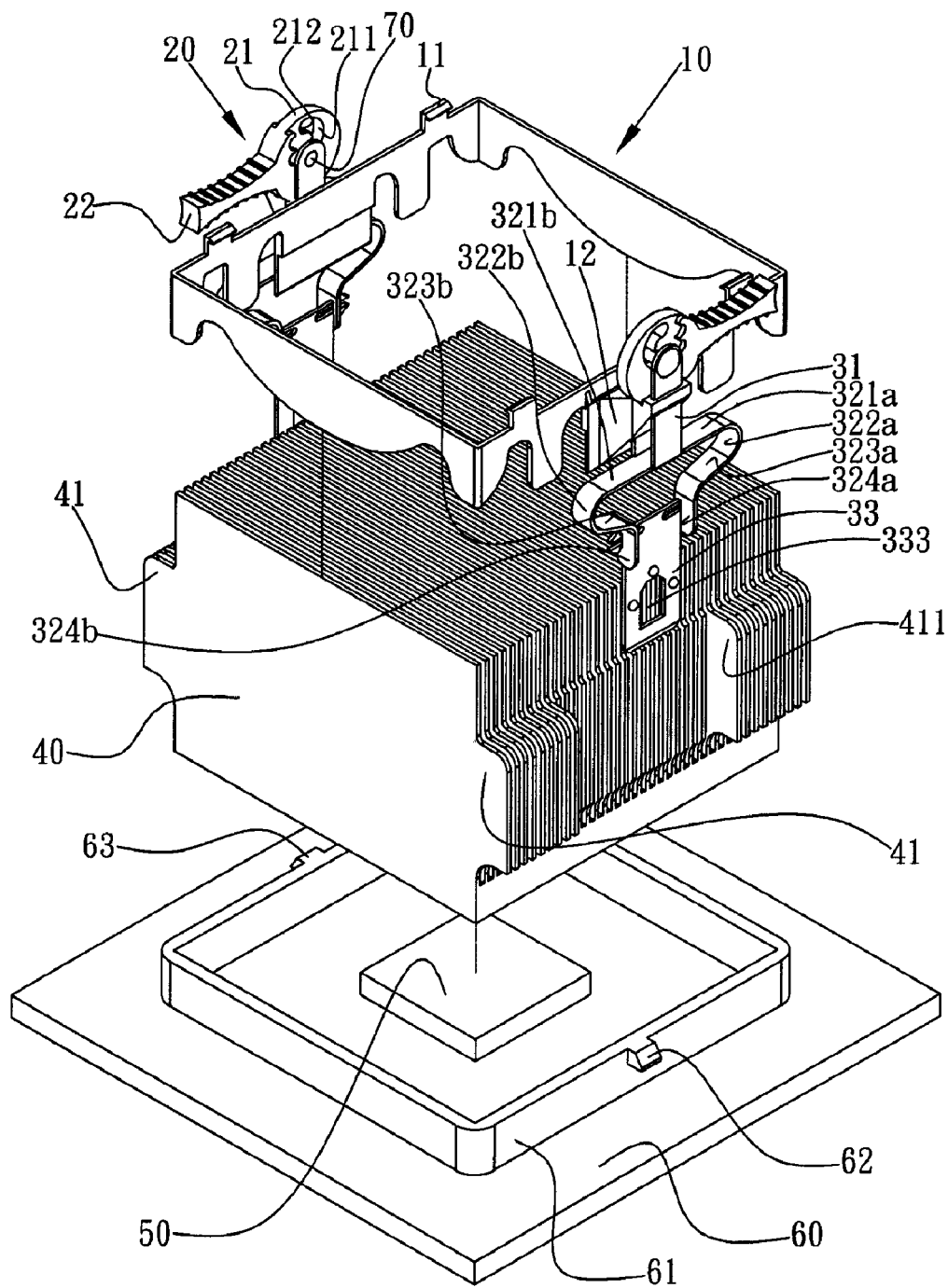
FIG. 3 is a disassembled perspective view illustrating the retaining device of the present invention in association with a heat sink and a heat generating component.
Figure 4:
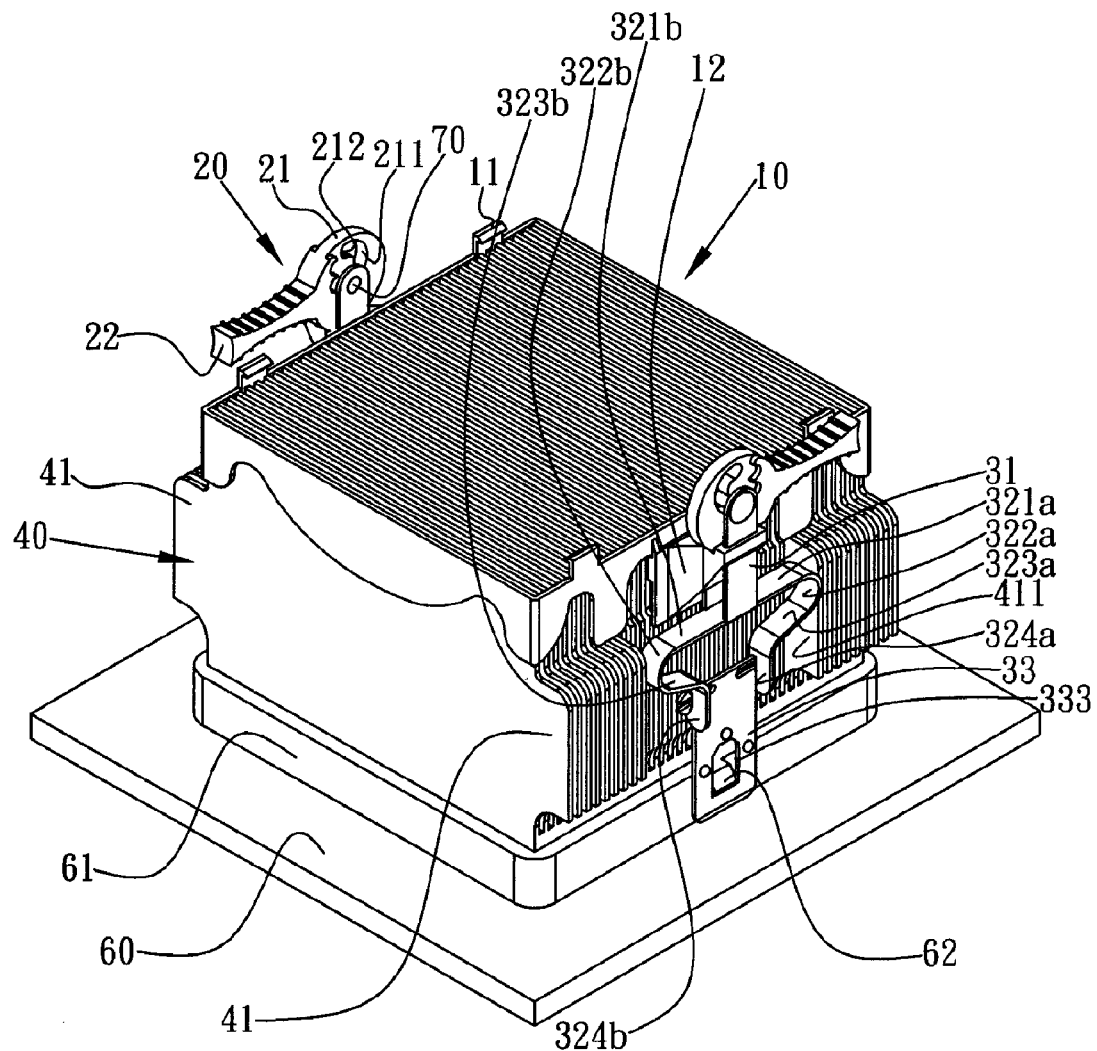
FIG. 4 is an assembled perspective view of FIG. 3.

Referring to FIGS. 3 and 4, the retaining device of the present invention is employed to allow the bottom of a heat sink 40 tightly contacting with a heat generating unit 50. The heat sink 40 is made of metal with good heat conductivity such as aluminum or copper and provides a plurality of fins to increase heat dissipating area. Alternatively, the heat sink 40 can be made with extruded aluminum, pressed cast or folded type with a shape other than the heat sink 40 shown in the figures and a heat pipe can be inserted through the heat sink 40. Besides, two opposite sides of the heat sink 40 have a protrusion part 41 respectively and once the heat sink 40 is placed on the heat generating component 50, heat from the heat generating component 50 can be transmitted with the heat sink 40 to assist the heat being sent outward.

The heat generating component 50 such as CPU is arranged on a circuit board 60, which has a locating base 61 surrounding the heat generating component 50 and provides an engaging lug 62, 63 at two opposite sides thereof for engaging with the engaging hole 333 of the engaging plate 33 respectively.

The frame 10 is attached to the upper portion of the heat sink 40 and the engaging member 30 are disposed at two opposite sides of the heat sink 40 in a recess 411 next to the protrusion 41 while the retaining device of the present invention is employed to engage the heat sink 40 to the heat generating component 50. Further, the engaging hole 333 of the engaging plate 33 engages with the engaging lugs 62, 63 respectively in a way of the lower side of the frame 10 held by the protrusion 41. Under this circumference, the engaging force of the engaging member 30 exerts a force to the heat sink 40 and the heat sink 40 is capable of keeping contact tightly with the heat dissipating component 50.

Figure 5:
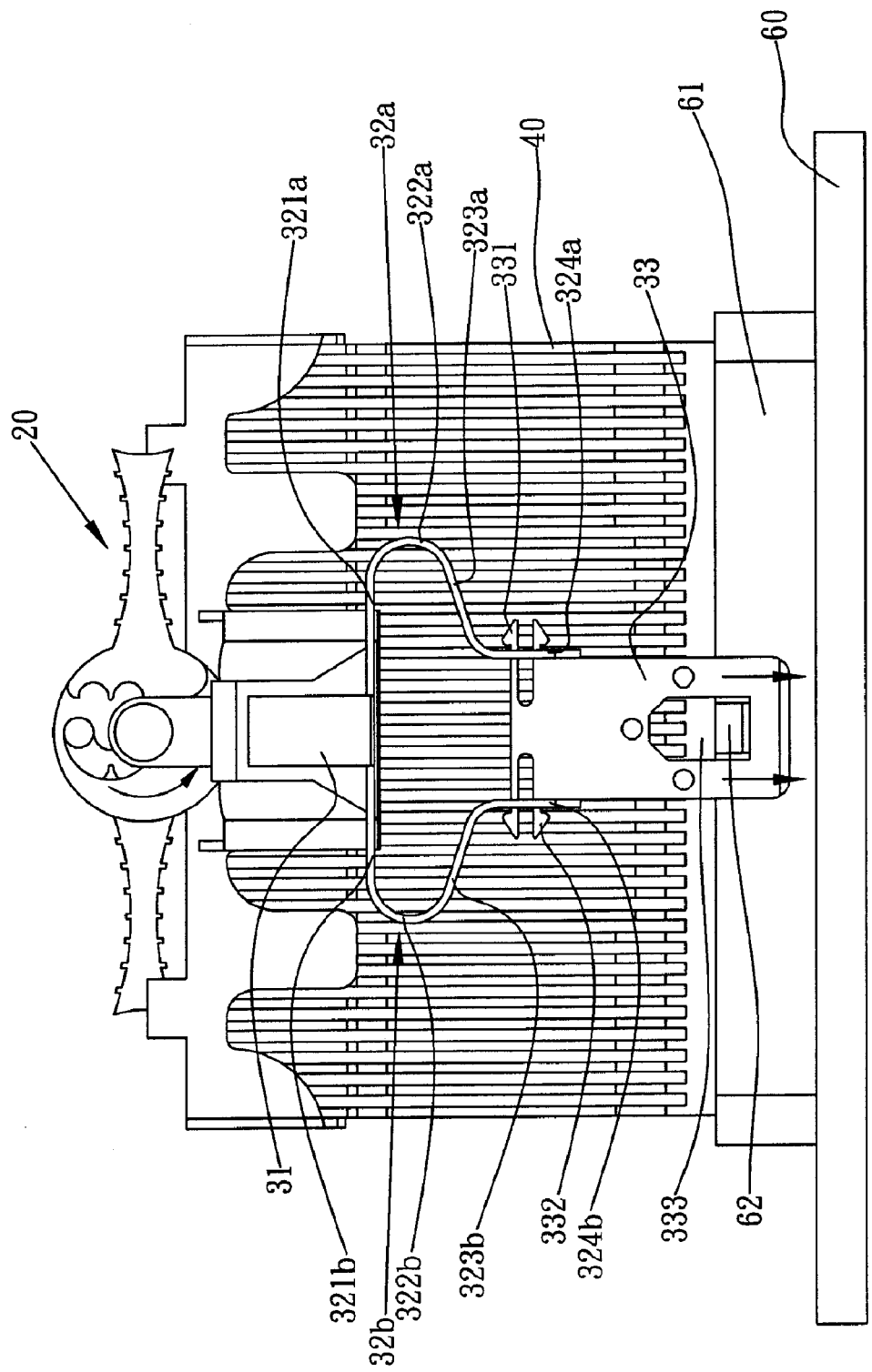
FIG. 5 is a plan view illustrating the retaining device engaging with the engaging lug.
Figure 6:
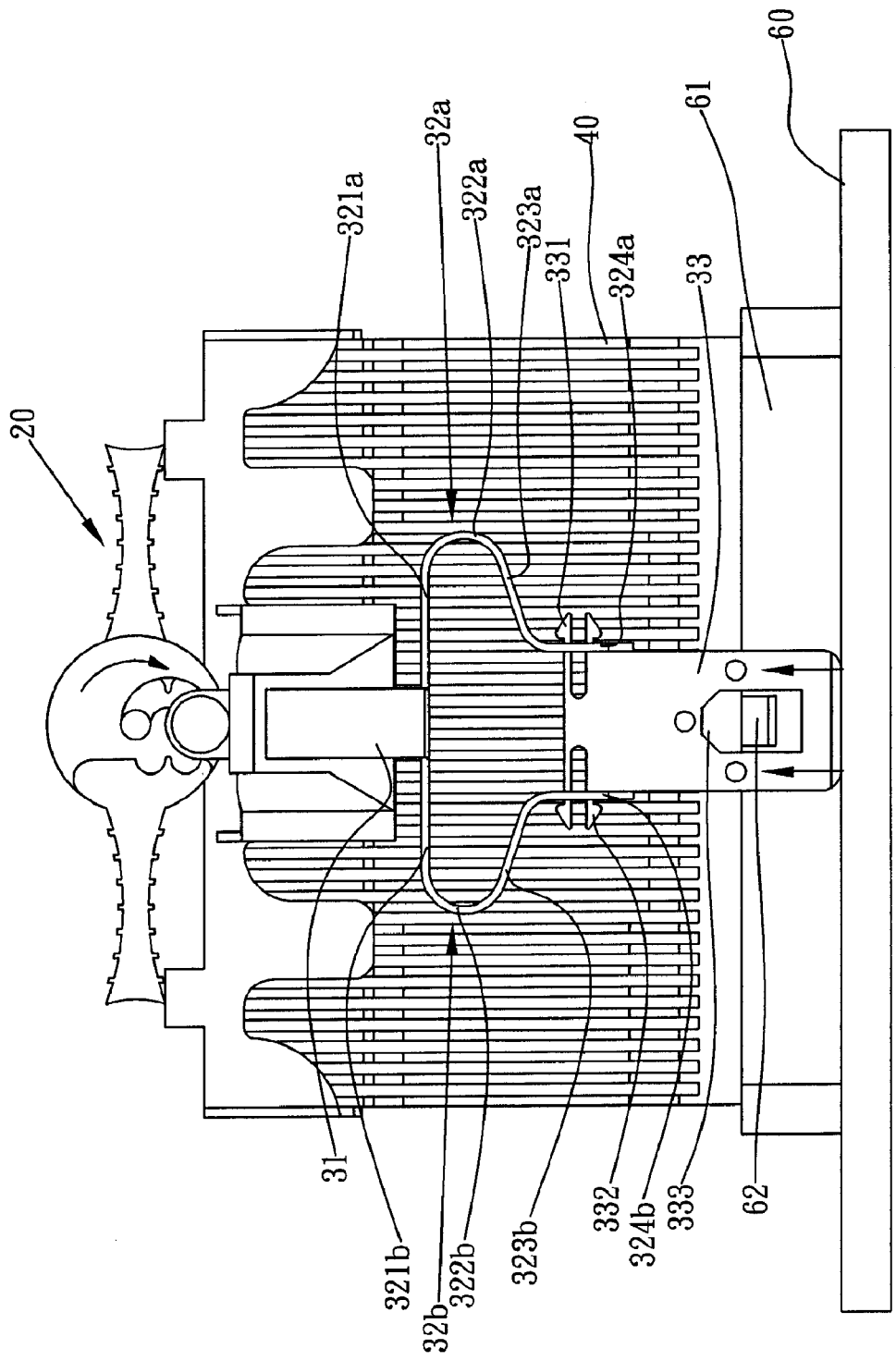
FIG. 6 is a plan view illustrating the retaining device releasing the engaging lug.
Figure 7:
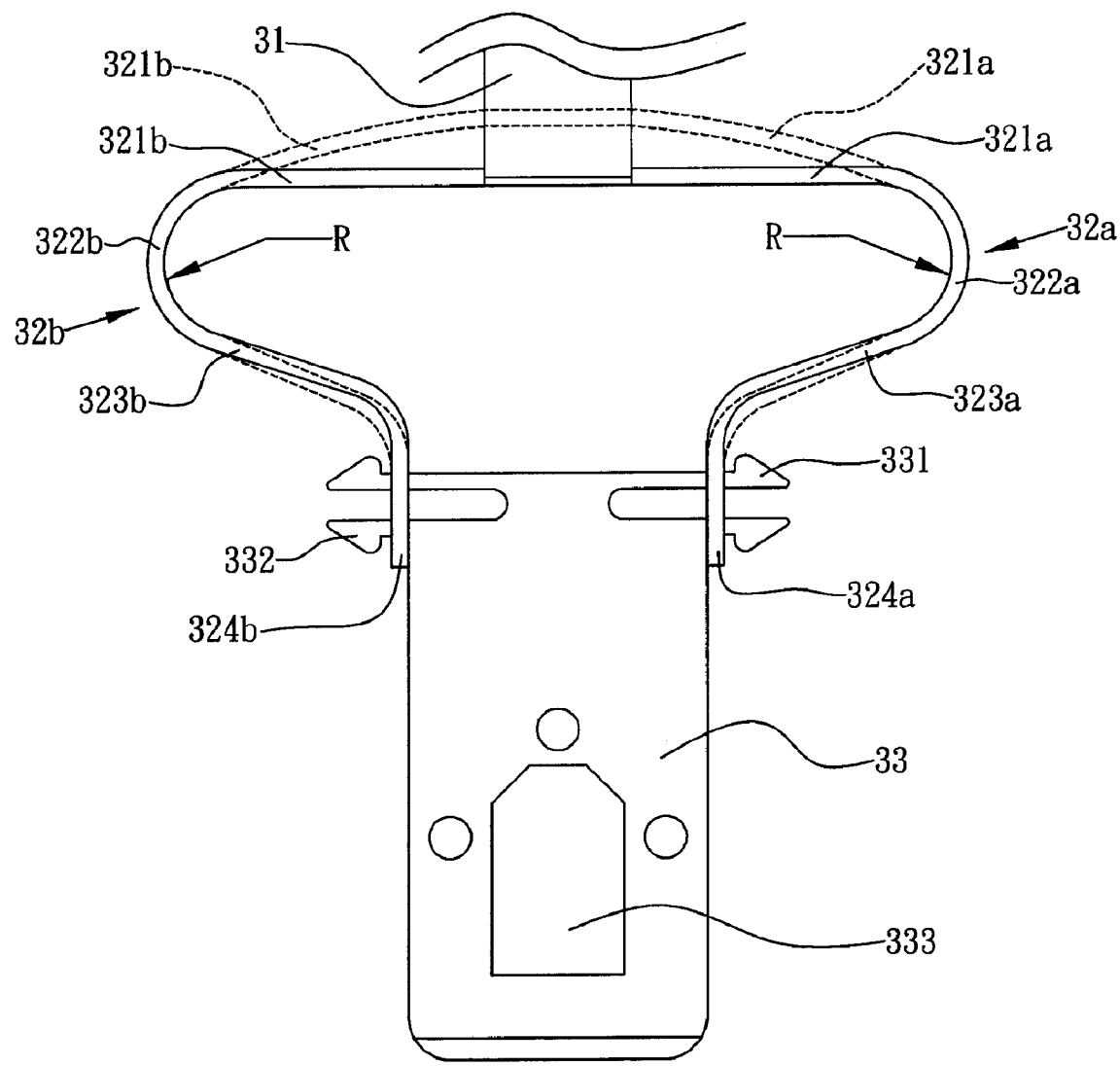
FIG. 7 is a plan view illustrating the first elastic member and the second elastic member of the retaining device while in a state of engaging and releasing.

Referring to FIG. 5, the engaging member 30 is in a state of tightening and the first and second elastic parts 32a, 32b are lifted upward with the follower part 31 such that the first elastic strip sections 321a, 321b and the second elastic strip sections 323a, 323b are forcedly expanded upward and downward elastically relative to the circular bands 322a, 322b as shown in FIG. 7. Besides, it can be seen in FIG. 6 that if the engaging member 30 is released, the elastic parts 32a, 32b restore the original state thereof and the first elastic strip sections 321a, 321b and the second elastic strip sections 323a, 323b move back resiliently as shown in FIG. 7. In this way, the engaging hole 333 is capable of being free from the engaging lugs 62, 63. The engaging member 30 being tightened or released can control the engaging force of the engaging plate 33 due to the circular bends 322a, 322b providing a radius R. In addition, the first and second elastic parts 32a, 32b are disposed at the right and left sides symmetrically such that the engaging force of the engaging plate 33 can be evenly exerted and the first and second elastic parts 32a, 32b, which occupy less spaces at two opposite sides of the heat sink 40 than the prior art, allow the radius of the circular bends 322a, 322b being greater than the prior art to result in more coefficient of elasticity than the prior art such that plastic deformation is incapable of occurring during the engaging member 30 being tightening and better elastic restoration is obtained during the engaging member 30 being released.

While the invention has been described with referencing to preferred embodiments thereof, it is to be understood that modifications or variations may be easily made without departing from the spirit of this invention, which is defined by the appended claims.

What is claimed is:

1. A retaining device for a heat sink comprising:
   a frame, which is attached to an upper portion of the heat sink, providing a projection at two opposite sides thereof and the projection having a contact face;
   at least an operation member having a main operation part and a stir part, wherein the main operation being disposed on top of the contact face and the stir part being actuated to rotate for the main operation part being capable of moving relative to the contact face; and
   at least an engaging member further comprising a follower part piercing the projection with an end thereof connecting with the main operation cart pivotally and another end thereof being joined to a first elastic part and a second elastic part, and the first elastic part and the second elastic part oppositely extending horizontally with a respective free end of both the elastic parts being joined to two opposite lateral sides of an engaging part; characterized in that the first and second elastic parts extend outward an engaging leg with a fitting hole respectively and the engaging part provides a hook part at two opposite sides thereof corresponding to the fitting hole.

2. The retaining device for a heat sink as defined in claim 1, wherein the first and second elastic parts each provide, a first elastic strip to curvedly extend a circular bend and then straightly extends downward a second elastic strip to form the hook leg.

* * * * *